(12) United States Patent
Yang

(10) Patent No.: US 7,435,467 B2
(45) Date of Patent: Oct. 14, 2008

(54) HEAT RESISTANT LABEL

(75) Inventor: Huimin Yang, Glendale, WI (US)

(73) Assignee: Brady Worldwide, Inc., Milwaukee, WI (US)

( * ) Notice: Subject to any disclaimer, the term of this patent is extended or adjusted under 35 U.S.C. 154(b) by 80 days.

(21) Appl. No.: 11/243,784

(22) Filed: Oct. 5, 2005

(65) Prior Publication Data

US 2007/0077384 A1    Apr. 5, 2007

(51) Int. Cl.
B32B 9/00 (2006.01)
B32B 3/00 (2006.01)
B32B 5/16 (2006.01)
B41M 5/00 (2006.01)

(52) U.S. Cl. .................. 428/40.1; 428/42.1; 428/195.1; 428/204; 428/206

(58) Field of Classification Search .................. 428/204, 428/206, 207, 40.1, 42.1, 195.1, 323, 328
See application file for complete search history.

(56) References Cited

U.S. PATENT DOCUMENTS

| | | | |
|---|---|---|---|
| 4,971,858 A | 11/1990 | Yamano et al. | 428/323 |
| 5,008,151 A | 4/1991 | Tominaga et al. | 428/343 |
| 5,145,726 A | 9/1992 | Sakuramoto et al. | 428/195 |
| 5,204,163 A | 4/1993 | Nakatsuka et al. | 428/195 |
| 5,209,796 A | 5/1993 | Sakuramoto et al. | 156/89 |
| 5,506,016 A | 4/1996 | Onodera et al. | 428/40 |
| 5,578,365 A | 11/1996 | Kume et al. | 428/195 |
| 5,780,142 A | 7/1998 | Kume et al. | 428/195 |
| 6,284,369 B1 | 9/2001 | Kume et al. | 428/355 |
| 6,416,845 B1 | 7/2002 | Kume et al. | 428/195 |
| 2005/0048271 A1* | 3/2005 | Iwasa et al. | 428/195.1 |

FOREIGN PATENT DOCUMENTS

| | | |
|---|---|---|
| EP | 1179577 A1 | 2/2002 |
| WO | 9403328 A1 | 2/1994 |
| WO | 2004063302 A2 | 7/2004 |

OTHER PUBLICATIONS

Elvacite Acrylic Resins product manual, pp. 1-40, date unknown.
Nitto Denko Products Information, Duratack S40H, Nitto Denko Corporation, date unknown.
Heatproof Technical Information, date unknown.
Product Info: About Heatproof, http://www.ysamerica.com/eng/heatproof/products/index.htm, Sep. 13, 2005.

* cited by examiner

*Primary Examiner*—Patricia L Nordmeyer
(74) *Attorney, Agent, or Firm*—Whyte Hirschboeck Dudek SC

(57) ABSTRACT

A heat-resistant, multi-layer label free of both glass frit and silicone resin is described. The label is suitable for use in high temperature applications, e.g., applications in which the label and object to which it is adhered are subjected to a temperature of 700 C. or more. The label before exposure to high temperature comprises: (A) an ink-receptive layer comprising an acrylic-based polymer and first and second planar surfaces (B) a base layer comprising first and second planar surfaces, the first planar surface of the base layer in intimate contact with the second planar surface of the ink-receptive layer, the base layer comprising inorganic powder and an organic binder and (C) a pressure sensitive adhesive (PSA) layer comprising an acrylic-based polymer and first and second planar surfaces, the first planar surface of the PSA layer in intimate contact with the second surface of the base layer.

19 Claims, 1 Drawing Sheet

HEAT RESISTANT LABEL

FIELD OF THE INVENTION

This invention relates to labels. In one aspect, the invention relates to heat resistant labels while in another aspect, the invention relates to heat resistant labels for identifying objects during a heat treatment process. In still another aspect, the invention relates to sheet materials that can be used as heat resistant labels while in yet another aspect, the invention relates to objects bearing such labels that have undergone a heat treatment process.

BACKGROUND OF THE INVENTION

Improving process inventory and quality control is a continuous and challenging endeavor that often includes the implementation of in-process bar code and other labeling systems. Fabrication of a bar code label that is able to survive high temperature processing conditions, e.g., 400 C or more, is particularly challenging. For example, a bar code label applied to a television picture tube, i.e., a cathode ray tube or CRT, must be readable with a scanner after exposure to temperatures greater than 400 C.

Green ceramic sheets, i.e., labels before they have been exposed to a high temperature, have been used as high temperature labeling material since at least as early as 1990. U.S. Pat. No. 4,971,858 (Yamano), U.S. Pat. No. 5,204,163 (Nakatsuka) and U.S. Pat. No. 5,209,796 (Sakuramoto) describe green ceramic sheets composed of a base layer and a layer of pressure-sensitive adhesive (PSA) protected with a release film. The base layer is fabricated from glass frit and one or more binder resins, e.g., a silicone resin, and it carries an image comprising a high temperature pigment. Labels made from such a sheet are applied to an object destined for high temperature processing in which the binder resin decomposes, the glass frit melts, and pigment adheres to the object.

U.S. Pat. No. 5,506,016 (Onodera), U.S. Pat. No. 5,578,365 (Kume), and U.S. Pat. No. 6,416,845 (Kume) also describe a green ceramic sheet formed from a base layer and a PSA layer but rather than using glass frit in the base layer, a silicone resin and/or rubber are included to hold the pigments on the object during and after the high temperature process. Yet another green ceramic sheet is described in U.S. Pat. No. 5,780,142 (Kume) as having a base layer of acrylic resin and glass frit, and an overlying silicone resin layer bearing an inked image.

One drawback of currently available high temperature labels is the use of glass frits due to their toxicity, particularly low melting point glass frits, which contain lead. Another drawback of current high temperature label materials is the inclusion of a silicone resin as a binder or ink-receptive layer, which can result in poor printability and, accordingly, narrow the selection of ribbons.

SUMMARY OF THE INVENTION

In one embodiment of this invention, a heat-resistant, multi-layer label free of glass frit, silicone resin and glass cloth or other similar reinforcing structure is described. The label is suitable for use in high temperature applications, e.g., applications in which the label and object to which it is adhered are subjected to a temperature of 700 C or more. The label before exposure to high temperature comprises:

A. An acrylic ink-receptive layer comprising first and second planar surfaces;
B. A base layer comprising first and second planar surfaces, the first planar surface of the base layer in intimate contact with the second planar surface of the ink-receptive layer, the base layer comprising inorganic powder and an organic binder;
C. An acrylic PSA layer comprising first and second planar surfaces, the first planar surface of the PSA layer in intimate contact with the second surface of the base layer; and
D. Optionally, a release liner or layer comprising first and second planar surfaces, the first planar surface of the liner in intimate contact with the second planar surface of the PSA layer.

Optionally, an ink-image layer may be in intimate contact with the first planar surface of the ink-receptive layer, i.e., the ink-receptive layer is imprinted with ink in the form of an image, e.g., a bar code.

"Inorganic powders" do not include glass frit, and the acrylics of the ink receptive and base layers exclude acrylics that do not substantially fully volatilize upon a relatively short exposure to temperatures of 700 C or more. Typically, the acrylics used in the practice of this invention as components of the ink-receptive, base and PSA layers essentially fully volatilize at temperatures less than about 500 C.

As here used, "glass frit", "frit" and similar terms refer to substances distinct from inorganic powders. Frit is inorganic powder fused into a glass, i.e., into an amorphous, undercooled liquid of extremely high viscosity with all the appearances of a solid. Glass frit typically comprises a mixture of silica, soda ash and lime, often with one or more metallic oxides, that has been fused at a typical temperature of about 1200 C. Many frits contain lead as an agent to lower their respective melting points. Frit is essentially water-insoluble, while many inorganic powders are water-soluble.

The label after exposure to high temperature for a relatively short period of time comprises:

A. An ink-image layer comprising first and second planar surfaces; and
B. A base layer comprising first and second planar surfaces, the first planar surface of the base layer in intimate contact with the second planar surface of the ink-image layer, the base layer comprising fused inorganic powder.

The acrylic polymers in the ink-receptive, base and PSA layers of the green label essentially fully volatilize well before the inorganic powders of the base layer fuse. The volatilization of acrylic polymers essentially eliminates the ink-receptive and PSA layers from the construction of the label and as the inorganic powders of the base layer fuse, the ink-image layer fuses with the base layer and the base layer fuses with the object to which the label is attached.

In another embodiment the invention is an object carrying a green label while in yet another embodiment, the invention is an object with the label fused to it as a result of exposing the object carrying the green label to a temperature of 700 C or more for a sufficiently long period of time to essentially fuse the inorganic powders of the base layer, the ink-image layer to the base layer, and the base layer to the object.

DETAILED DESCRIPTION OF THE INVENTION

Figure 1:
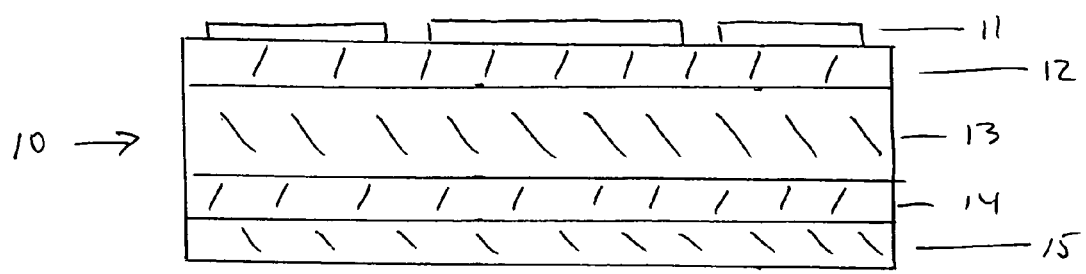
FIG. 1 is a schematic of one embodiment of a green label with a release liner.

The invention is described generally with reference to the drawings for the purpose of illustrating the certain embodiments only, and not for the purpose of limiting the scope of the invention. In the drawings like numerals are used to designate like parts throughout the same.

Figure 2:
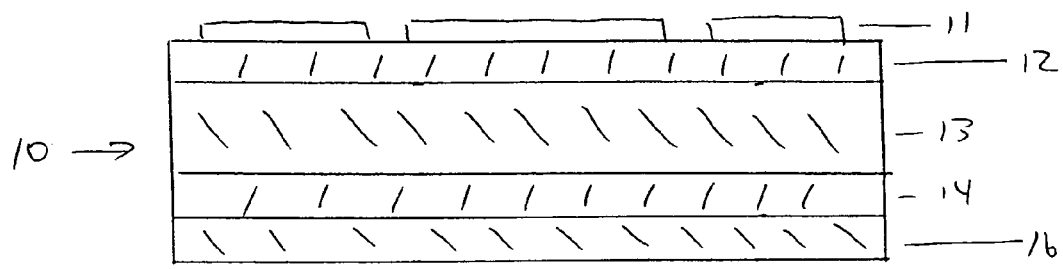
FIG. 2 is a schematic of the green label of FIG. 1 with the release liner removed and the label affixed to an object.

FIG. 1 is a schematic drawing of green label 10 comprising ink-image 11 in intimate contact with a first planar surface of ink-receptive layer 12. The second planar surface of ink-receptive layer 12, which is opposite the first planar surface, is in intimate contact with a first planar surface of base layer 13. The second planar surface of base layer 13, which is opposite the first planar surface of base layer 13, is in intimate contact with a first planar surface of PSA layer 14. The second planar surface of PSA layer 14, which is opposite the first planar surface of PSA layer 14, is in intimate contact with a first planar surface of release liner 15. FIG. 2 illustrates the green label of FIG. 1 with release liner 15 removed, and the label adhered to an object 16.

"Planar surface" is used in distinction to "edge surface". If rectangular in shape or configuration, a label will comprise two opposing planar surfaces joined by four edge surfaces (two opposing pairs of edge surfaces, each pair intersecting the other pair at right angles). The first planar surface of the ink-receptive layer is adapted to receive the ink-image, e.g., bar code, from a printer or other image-delivering device, while the second planar surface is adapted to join with the first planar surface of the base layer, and so forth. The labels can be of any size and shape and as such, so can the planar and edge surfaces, e.g., thin or thick, polygonal or circular, flat or wavy, etc.

The ink used to form the image carried on the label is any heat-resistant pigmented or colored liquid, paste, solid or powder capable of forming an image on the first planar surface of the ink-receptive layer and adapted for use in processes in which the temperature can exceed 700 C. Any known process can be used to prepare the ink, e.g., by mixing one or more inorganic coloring agents (colorants) with a compatible solvent, and with optional additives such as an organic binder, ceramic powder, plasticizer, and/or a dispersant. The ingredients are mixed, typically in a ball mill or like device, to prepare flowable ink in the form of a paste or liquid. The ink can be, for example, in a liquid form and packaged for use in ink-jet printing, used as a liquid for screen printing, packaged in dry form as a laser printer toner, or coated onto a film and dried along with other layers for thermal transfer printing. Examples of inorganic colorants and pigments for the ink include metal powders and metal oxides such as the oxides of iron, nickel, chromium, cobalt, manganese and copper. Examples of organic binders include waxes such as paraffin waxes, carnauba waxes, and natural waxes, among others, and resins such as acrylic resins, silicone resins, polyamide resins, and the like. The ink can be either water or solvent based. Examples of solvents include toluene, isopropanol, and the like.

Image 11 can be printed directly upon the first planar surface of ink-receptive layer 12 by printing techniques that are known and used in the art, including, for example, screen printing, dot-matrix, ink jet, laser printing, laser marking, and thermal transfer, among others. As an example, ink-image 11 can be applied through a thermal transfer of black metal oxides onto the ink-receptive layer using a thermal transfer ribbon. Examples of ink-image 11 that can be applied to the ink-receptive layer include characters, design patterns, graphics and bar code patterns, among others.

Ink-receptive layer 12 is made of thermally decomposable organic material such that the layer will decompose (volatilize) and disappear at a temperature well below the temperature at which the inorganic powders of the base layer will fuse. Typically, after the green label is attached to an object, the object is heated and subjected to a heat treatment. For purposes of this invention, the heat treatment is typically in excess of 700 C. The temperature of the object, and thus the label, is gradually raised from ambient, e.g., 25 C, to the minimum heat treatment temperature of about 700 C at a rate of about 10-20 C per minute. During this rise in temperature, typically between about 300 and 500 C, all of the organic components of the label, including the acrylic components of the ink-receptive, base and PSA layers essentially completely volatilize. "Heat treatment", "fire", "burn" and the like mean a procedure in which the green label, while attached to an object, is subjected to a temperature of at least 700 C for a sufficient period of time to fuse the inorganic powders of the base layer of the label, the ink-image to the base layer, and the base layer to the object. Typically the temperature of the heat treatment does not exceed about 1000 C. The heat treatment can take place in the presence or absence of a reactive atmosphere, or in a vacuum.

Preferred materials for ink-receptive layer 12 are acrylic-based polymers that burn off cleanly while ink-image 11 is retained on base layer 13 which itself is retained on object 16. Preferred examples of acrylic-based polymers include poly (methyl methacrylate), poly(ethyl methacrylate), poly(butyl methacrylate), and copolymers of one or more of methyl methacrylate, ethyl methacrylate and butyl methacrylate, and acrylic acid. The ink-receptive layer is free of glass frit and silicone resins.

Base layer 13 is fabricated in part from heat-resistant materials that are stable, i.e., not burned off, during a heat treatment (firing) at temperatures of 700 C or more over a period of about 10 minutes. Preferably, the materials are non-thermally (non-heat) decomposable at temperatures of about 700 C, more preferably 900 C and even more preferably 1000 C, over a period of 10 minutes. Base layer 13 provides label 10 with structural strength and support for the other components of its composition prior to heat treatment. Preferably, after exposure to the heating (firing) temperature, base layer 13 does not significantly char, outgas, shrink or otherwise change so as to adversely affect or alter its initial character.

Base layer 13 is also composed in part of organic resin binders. These binders can comprise any natural or synthetic polymer that will burn off during the heat treatment process. Typically these resins or polymers are acrylic-based, and the acrylic polymers identified for use in the ink-receptive layer are useful in the base layer as well. The base layer does not contain glass frit, silicone resin or reinforcing glass cloth or similar reinforcing structures.

Although not a limiting factor and depending in part upon the composition of the object to which the label of this invention will ultimately be affixed, the particle diameter or size of the inorganic powders used in the base layer is typically between greater than zero and about 200 microns (µm), preferably between about 0.05 and about 150 µm and even more preferably between about 0.1 and about 100 µm. In addition, the distribution of particle sizes within these ranges is such that preferably about 35-45 percent of the total particles are within the smallest third of the particles, about 35-45 percent of the total particles are within the largest third of the particles, and about 10-30 percent of the total particles are within the middle third of the particles. By way of example, an inorganic powder with a particle size distribution of between greater than zero and 200 for use in a label with a base layer having a thickness of about 200 µm would preferably have 35-45% of its particles in a size range of greater than zero and about 66 μm, 10-30% of its particles in a size range of about 66 to about 132 μm, and about 35-45% of its particles in a size range of about 132 to 200 μm.

As a practical matter, the upper end of the particle size range is set by the thickness of the base layer. Ideally, no individual particle is larger than the target thickness of the base layer.

The distribution of particles across the lower end of the particle size range is more a function of final label quality, i.e., the appearance of the label after it has been permanently affixed (fused) to the object, than anything else. Without being bound to theory, if the base layer contains a disproportionate amount of small particles relative to the other particles in the particle size distribution, then the layer has a tighter "pack" than if the particle size distribution contains a good mix of large and small particles. The tighter the pack of the base layer, the more difficult for the volatiles of the PSA layer to escape through it during the heat treatment. Poor passage of the volatiles from the PSA layer through the base layer can lead to the build-up of stress within the base layer and this can, in turn, lead to cracks in the label fused to the object. Base layers in which a large majority of particles are of a size of about 10 μm or less often produce labels with severe cracking regardless of the particle size distribution. Base layers in which a large majority of particles are of a size of about 50 μm or less often produce labels with small but acceptable cracking notwithstanding an otherwise good distribution of particle sizes. Base layers in which at least about 35% of the particles are about 50 μm or greater in size typically produce final (fused) labels with little, if any, noticeable cracking.

In addition, a disproportionate amount of small particles relative to the other particles in the particle size distribution of the base layer provides more opportunity for the small particles to contact one another and ultimately fuse with one another. This, in turn, can result in greater stresses within the fused base layer than would result from the fusion of large particles with one anther, or small particles with large particles, and this, in turn, can result in increased cracking of the fused base layer.

Exemplary inorganic powders include metal powders, ceramic powders and the like. Examples of specific inorganic powders that can be used include powders of silica, alumina, titania, zirconia, zinc oxide, calcium oxide, mica, potassium titanate, aluminum borate, feldspar ($Na_2O_3.Al_2O_3.3SiO_2$), mullite ($3Al_2O_3.3SiO2$), kaolin ($Al_2O_3.3SiO_2.2H_2O$), spodumene ($Li_2.Al_2O_3.4SiO_2$), borax and other white or off-white powders. Also useful are metal compounds such as metal carbonates, metal nitrates, metal sulfates, and the like, that oxidize to form a white ceramic, for example, calcium carbonate, barium sulfate, and the like. Additional examples of inorganic powders include dark-colored inorganic particles, for example, powders of manganese oxide, chromium oxide (chromate), selenium sulfide, cobalt oxide, vanadium oxide, and the like. Also useful are inorganic powders that adhere to mica or other such material to form a flaky powder that enhances opaqueness and/or reflectivity, e.g., titanium dioxide coated mica. The inorganic particles of the base layer can also provide a background color to the image upon completion of the heat treatment process.

The relative amounts of inorganic powder to organic binder can vary widely, and is not critical to the practice of this invention. Typically, only sufficient organic binder is used to maintain the integrity of the base layer of the green label through fabrication, printing, shipping and storage. Excess organic binder provides little advantage to either the green label, and only adds time to the heat treatment process to rid all layers of volatiles. Typically, the weight ratio of inorganic powder to organic binder is between about 4 to about 6, preferably between about 5 and about 5.8 and more preferably between about 5.3 and about 5.6.

Pressure sensitive adhesive layer 14 is composed of organic and inorganic material. The relative amounts, typically measured on a solids basis, of organic and inorganic material in the PSA layer can vary widely and to convenience. The organic material will decompose and disappear during heating (burning) at a temperature well below about 700 C. To avoid discoloration of the label, the adhesive should not leave any carbonized products as a result of the heat treatment process. Preferably, an acrylic-based pressure sensitive adhesive is used. These adhesives are well known in the art and widely commercially available. Preferred acrylic adhesives comprise a polymer of an alkyl ester of an acrylic acid or methacrylic acid as a main component. The inorganic material, e.g., inorganic powders such as those used in the base layer, promote fusion of the base layer to the object.

Release liners that will cleanly release from the adhesive layer can be used in the practice of this invention. Exemplary liners include plastic film and paper. The releasable liner protects the second planar surface of adhesive layer 14 until green label 10 is attached to an object.

Green label 10 is constructed using conventional techniques and materials. In one embodiment, the ink-receptive material is coated onto a release liner using any conventional technique and equipment, e.g., rolling with a roller coater, spreading with a doctor blade, spraying, dipping and the like. The release liner for this preparation step is any liner that will release cleanly from the ink-receptive layer upon drying of the layer. Typically, the liner is not the same as that used to protect the PSA layer. Plastic film liners are preferred in the preparation of the ink-receptive layer because they typically leave a smoother surface upon removal than do paper liners and this, in turn, promotes good print quality. Paper release liners are typically preferred to plastic release liners for protecting the PSA layer because paper liners are generally less expensive than plastic liners.

After the ink-receptive layer has dried (with or without exposure to super-ambient heat, e.g., in an oven) the base layer is coated onto the top (second surface) of the ink-receptive layer, again using any conventional technique and then dried (with or without super-ambient heat). Depending upon the desired thickness of the base layer, this step may be repeated one or more times.

After the base layer has dried, the PSA is coated onto the top (second surface) of the base layer and dried (usually in an oven, the drying temperature dependent upon the nature and amount of the PSA). The PSA layer can be applied over the entire second surface of the base layer, or as a pattern of elements (e.g., dots, grid, lines, etc.) onto the surface of the base layer. The dried PSA layer is then covered with a release liner, and the release liner covering the ink-receptive layer is removed exposing a smooth surface (first surface of the ink-receptive layer) ready for receiving an image, e.g., from a thermal transfer printer using a high temperature ribbon.

The ink-receptive layer is typically between about 1 and about 5 μm in thickness, the base layer is typically between about 50 and about 200 μm in thickness, and the PSA layer is typically between about 15 and about 25 μm in thickness. The overall thickness of the green label is typically between about 66 and about 230 mils (without the release liner). Labels intended for use with ceramic and glass objects preferably are thinner than labels intended for metal objects, particularly steel objects. Label thickness for ceramic and glass objects is typically between about 70 and about 130 μm, preferably between about 90 and 110 μm. Label thickness for metal objects, particularly steel objects, is typically between about 100 and 150 μm, preferably between about 120 and 130 μm.

Figure 3:
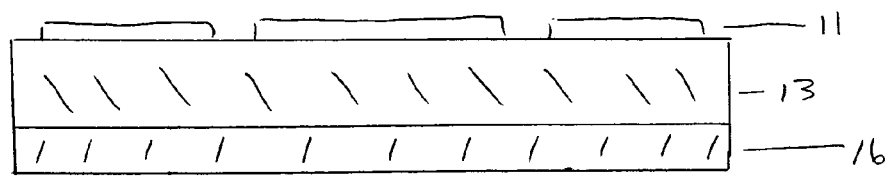
FIG. 3 is a schematic of the green label of FIG. 2 fused to the object after exposure to a temperature of 700 C or more for a sufficiently long period of time to essentially fuse the inorganic powders of the base layer, the ink-image layer to the base layer, and the base layer to the object.

The heat-resistant labels of this invention are used in any conventional manner. After the green label is constructed, it can be stored in any convenient manner, typically on a roll with or without a release liner protecting the first or top surface of the ink-receptive layer. When needed, an image is imparted to the first or top surface of the ink-receptive layer (after, of course, removal of the release liner from this surface, if present) in any conventional manner, e.g., printing, thermal transfer, etc., the release liner removed from the second surface of the PSA layer, and the green label applied to an object. The object is typically one of metal (e.g., steel coil or plate), or ceramic (e.g., circuit boards, plumbing fixtures), or glass (e.g., high-temperature safety glass), and the object with the green label is subjected to a heat treatment, e.g., 700-1000 C for 10-30 minutes. The heat treatment can take place in the presence or absence of an atmosphere, and if an atmosphere is present, it can be either reactive (e.g., oxygen-containing) or inert (e.g., oxygen-free). During this treatment, the organic components of the ink-receptive, base and adhesive layers are burned off, and the label is essentially permanently affixed to the object. FIG. 3 illustrates the construction of the label after the heat treatment. The organic components, e.g., the acrylic-based resins, are essentially completely volatilized such that little, if any, residue remains in any layer. In essence, the ink-receptive and adhesive layers are removed, and the image fuses with the base layer, and the base layer with the object.

The invention is described in more detail by reference to the following examples. Unless otherwise indicated, all parts and percentages are by weight.

EXAMPLES

Materials:

Table 1A describes the materials and formulation ranges that can be used to prepare the inventive labels of these examples. Table 1B describes the specific formulations of the inorganic powders used to make the base layer of the inventive labels reported in Table 2. The components of each layer were blended with one another to form a relatively homogeneous mixture that flowed smoothly. Conventional mixing equipment, a ball mill, was used to prepare the formulations of the base and adhesive layers. The powder materials were ball-mixed for two hours, and then the binder or adhesive solutions were added and mixed for at least one hour. The ink-receptive layer was prepared by dissolving the acrylic polymers in the solvent mixtures with an overhead mixer until a clear solution was obtained. The ball milling and mixing were done under ambient conditions.

TABLE 1A

Materials and Formulations of the Inventive Labels

| Component | Amount (wt %)* | Function | Supplier |
|---|---|---|---|
| Ink-Receptive Layer | | | |
| Elvacite 2008 Methylmethacrylate Resin (Low Molecular Weight) | 0-20 | Ink Reception | Lucite International |
| Elvacite 2041 Methylmethacrylate Resin (High Molecular Weight) | 6-26 | Ink Reception | Lucite International |
| Toluene | 10-74 | Solvent | Chemcentral |
| Methyl Ethyl Ketone | 0-64 | Solvent | Chemcentral |
| Base Layer | | | |
| White 6700 | 40-50 | Pigment | Sheffield Pottery |
| Borax | 2-6 | Flux | Sheffield Pottery |
| Flint (Silica) | 3-10 | Fusing | Sheffield Pottery |
| Anti-terra-U | 0.5-0.6 | Dispersant | BYK Chemie |
| Santicizer 160 | 2-3 | Plasticizer | Ferro |

TABLE 1A-continued

Materials and Formulations of the Inventive Labels

| Component | Amount (wt %)* | Function | Supplier |
|---|---|---|---|
| Dow Additive 56 | 1 | Flow Agent | Dow Corning |
| Dee FO PI-209R | 0.2-0.3 | Defoamer | Ultra Additives |
| Toluene | 14-17 | Solvent | Chemcentral |
| MB2766 (40%) Acrylic Resin | 24-66 | Binder | Dianal American |
| Adhesive Layer | | | |
| Borax | 7-12 | Adhesive | Sheffield Pottery |
| Flint (Silica) | 8-10 | Fusing | Sheffield Pottery |
| Sodium Silicofluoride | 3-5 | Metal Adhesive | KC Industries, LLC |
| Anti-terra-U | 0.4-0.55 | Dispersant | BYK Chemie |
| Ethyl Acetate | 7-9 | Solvent | Chemcentral |
| Aroset PS-6242 (51%) Acrylic Resin | 40-50 | Adhesive | Ashland Chemical Company |
| Toluene | 19-22 | Solvent | Chemcentral |

*For those components in which the amounts are designated as ranges, the exact amount was dependent upon the temperature range to which the label was to be exposed. For example, more borax, less flint and less White 6700 are preferred in a formula for a lower temperature (e.g., 700 C.) application than a high temperature (e.g., 900 C.) application to promote good fusion of the label to the substrate and an overall good appearance.

TABLE 1B

Inorganic Powder Formulations of the Inventive Labels Reported in Table 2

| | FC-103 | FC-107 | FC-108 | FC-109 | FC-110 |
|---|---|---|---|---|---|
| White 6700* | 28 | 46.7 | 44 | 40 | 49 |
| Borax* | 11.3 | 2.3 | 5.5 | 5 | 2.3 |
| Flint* | 14 | 5.8 | 5.5 | 10 | 3.5 |

*Weight percent based on the total weight of the formulation as described in Table 1A. Other than the ink image, these powders, in a fused state, are all that remain of the label after firing. All other formulation ingredients are either removed during formulation, e.g., solvents, or are volatilized during firing.

Label Construction:

The ink-receptive layer was coated onto a sheet of plastic film release liner using a wire wound rod method and dried at room temperature. The base layer was then applied to the exposed planar surface of the ink-receptive layer using a reverse roll method, and then dried in an oven at 90-120 C for about 3 minutes. The adhesive was then applied to the exposed surface of the dried base layer using a reverse roll method and dried in an oven at 120 C for about 3 minutes. Finally, the exposed planar surface of the dried adhesive layer was covered with a paper release liner. The release liner covering the top or first planar surface of the ink-receptive layer was then removed exposing a smooth, ink-receptive layer ready for printing with a high temperature ribbon, e.g., a ribbon formulated with one or more heat resistant pigments that do not decompose or change color during heat treatment at a temperature above 700 C, from a thermal transfer printer. The green labels were then fed through a thermal transfer printer that imparted a bar code to each.

Testing:

The labels were applied onto both ceramic tiles and steel plates, and then subjected to high temperature processes in air. After the samples were allowed to cool to room temperature, their appearance, bar code readability and adhesion to the substrates were examined. For comparison, commercially available heat-resistant labels from Nitto Denko and Yushi-Seihin were also tested. The results are reported in Table 2.

TABLE 2

High Temperature Test Results

| | Temp(C.)/Time(min)[1] | Appearance[2] On Ceramic | On Steel | Bar code On Ceramic | On Steel | Remarks |
|---|---|---|---|---|---|---|
| Sample | | | | | | |
| FC-110 | 900/120 | Good | Fair | Readable | Readable | |
| FC-107 | 900/15 | Good | Good | Readable | Readable | |
| FC-108 | 800/15 | Good | Good | Readable | Readable | |
| FC-109 | 700/15 | Good | Fair | Readable | Readable | Images Slightly Smeared on Steel[3] |
| FC-103 | 650/30 | Poor | Poor | Readable | Readable | Images Slightly Smeared on Steel[3] |
| Comp Samples | | | | | | |
| Nitto Denko | 800/15 | Good | Poor | Readable | Not Readable | |
| | 600/15 | Good | Poor | Readable | Not Readable | |
| | 500/15 | Good | Good | Readable | Readable | |
| Yushi-Seihin | 600/15 | Poor | Fair | Not Readable | Readable | |
| | 500/15 | Poor | Good | Not Readable | Readable | Delaminated from Ceramic |

[1] Ramped up at a rate of 20 C./min from room temperature to the predetermined temperature, kept at the predetermined temperature for the predetermined time period, and cooled down to room temperature at a rate of 20 C./min.
[2] Good - Smooth surface without smear, bubbles, cracks or delamination.
Fair - Slight smear, small cracks or slight delamination at the edges or corners, but without affect on the readability of the bar code.
Poor - Serious cracks or delamination that adversely affect the functionality of the label.
[3] Upon light rubbing with a finger.

Although the invention has been described in considerable detail, this detail is for the purpose of illustration. Many variations and modifications can be made on the invention as described in the following claims without departing from its spirit and scope. All patents and allowed patent applications identified above are incorporated by reference into this specification.

What is claimed is:

1. A heat-resistant, multi-layer label comprising:
   A. An ink-receptive layer comprising an acrylic-based polymer and first and second planar surfaces;
   B. A base layer comprising first and second planar surfaces, the first planar surface of the base layer in intimate contact with the second planar surface of the ink-receptive layer, the base layer consisting essentially of inorganic powder and an organic binder at a weight ratio of about 4 to about 6; and
   C. A pressure sensitive adhesive (PSA) layer comprising an acrylic-based polymer and first and second planar surfaces, the first planar surface of the PSA layer in intimate contact with the second surface of the base layer;
with the proviso that the label is free of both glass frit and silicone, and that the label will withstand a temperature of 700° C. or more.

2. The label of claim 1 further comprising a first release liner comprising first and second planar surfaces, the first planar surface of the liner in intimate contact with the second planar surface of the PSA layer.

3. The label of claim 2 in which the first release liner is paper.

4. The label of claim 3 further comprising a second release liner comprising a plastic film with first and second planar surfaces, the second planar surface of the second liner in intimate contact with the first planar surface of the ink-receptive layer.

5. The label of claim 1 in which the first planar surface of the ink-receptive layer bears an image comprising a heat-resistant ink.

6. The label of claim 5 in which the image is a bar code.

7. The label of claim 5 in which The second planar surface of the PSA layer is in adhering contact with a metal, ceramic or glass object.

8. The label of claim 7 in which the object is a steel coil, steel plate, steel bar, ceramic plumbing fixture, ceramic circuit board, or high-temperature safety glass.

9. The label of claim 1 in which the ink-receptive layer comprises an acrylic-based polymer selected from the group consisting of poly(methyl methacrylate), poly(ethyl methacrylate), poly(butyl methacrylate), and copolymers of one or more of methyl methacrylate, ethyl methacrylate and butyl methacrylate, and acrylic acid.

10. The label of claim 1 in which the inorganic powder of the base layer comprises at least one powder of silica, alumina, titania, zirconia, zinc oxide, calcium oxide, mica, potassium titanate, aluminum borate, feldspar, mullite, kaolin, spodumene, borax, and a metal carbonate, nitrate, sulfate and oxide.

11. The label of claim 1 in which the inorganic powder of claim 5 comprises particles ranging in size from greater than zero to about 200 microns.

12. The label of claim 11 in which distribution of particle sizes is such That about 35-45 percent of the total particles are within the smallest third of The particles, about 35-45 percent of the total particles are within the largest third of the particles, and about 10-30 percent of the total particles are within the middle third of the particles.

13. The label of claim 12 in which at least about 35 percent of the total particles are about 50 microns or larger in size.

14. The label of claim 1 in which the organic binder of the base layer comprises an acrylic-based polymer.

15. The label of claim 14 in which the acrylic-based polymer of the base layer is selected from the group consisting of poly(methyl methacrylate), poly(ethyl methacrylate), poly (butyl methacrylate), and copolymers of one or more of methyl methacrylate, ethyl methacrylate and butyl methacrylate, and acrylic acid.

16. The label of claim 1 further comprising a second release liner comprising first and second planar surfaces, the second planar surface of the second liner in intimate contact with the first planar surface of the ink-receptive layer.

17. The label of claim 16 in which the second release liner is a plastic film.

18. The label of claim 1 having a thickness of between about 66 and 230 microns.

19. An object in adhering contact with the second planar surface of the PSA layer of the label of claim 1.

* * * * *